(12) United States Patent
Lee et al.

(10) Patent No.: US 8,787,416 B2
(45) Date of Patent: Jul. 22, 2014

(54) LASER DIODE USING ZINC OXIDE NANORODS AND MANUFACTURING METHOD THEREOF

(75) Inventors: Sang Wuk Lee, Seoul (KR); Tae Won Kang, Seoul (KR); Gennady Panin, Seoul (KR); Hak Dong Cho, Gyeonggi-do (KR)

(73) Assignee: Dongguk University Industry-Academic Cooperation Foundation, Seoul (KR)

( * ) Notice: Subject to any disclaimer, the term of this patent is extended or adjusted under 35 U.S.C. 154(b) by 0 days.

(21) Appl. No.: 13/518,440

(22) PCT Filed: Sep. 10, 2010

(86) PCT No.: PCT/KR2010/006172
§ 371 (c)(1),
(2), (4) Date: Aug. 28, 2012

(87) PCT Pub. No.: WO2011/078467
PCT Pub. Date: Jun. 30, 2011

(65) Prior Publication Data
US 2012/0314726 A1 Dec. 13, 2012

(30) Foreign Application Priority Data
Dec. 23, 2009 (KR) .................. 10-2009-0130085

(51) Int. Cl.
*H01S 3/14* (2006.01)
*H01S 5/00* (2006.01)

(52) U.S. Cl.
USPC .......................... 372/44.01; 372/39

(58) Field of Classification Search
USPC .................... 372/44.01, 39
See application file for complete search history.

(56) References Cited

U.S. PATENT DOCUMENTS

| 5,895,938 A * | 4/1999 | Watanabe et al. ............. 257/77 |
| 2006/0189018 A1 | 8/2006 | Yi et al. |
| 2007/0235738 A1 | 10/2007 | Jin et al. |
| 2011/0163292 A1 * | 7/2011 | Wang et al. .................. 257/13 |

FOREIGN PATENT DOCUMENTS

| KR | 10-2005-0001582 A | 1/2005 |
| KR | 10-2006-0024197 A | 3/2006 |
| KR | 10-2006-0121413 A | 11/2006 |
| KR | 10-2006-0121432 A | 11/2006 |

OTHER PUBLICATIONS

International Search Report for Application No. PCT/KR2010/006172 dated May 30, 2011.

* cited by examiner

*Primary Examiner* — Armando Rodriguez
(74) *Attorney, Agent, or Firm* — Alston & Bird LLP

(57) ABSTRACT

Provided are a laser diode using zinc oxide nanorods and a manufacturing method thereof. The laser diode using zinc oxide nanorods according to one embodiment of the present disclosure includes: a wafer; an electrode layer formed on the wafer; a nanorod layer including a plurality of n-doped zinc oxide nanorods grown on the electrode layer; and a p-doped single crystal semiconductor layer that is physically in contact with the ends of the zinc oxide nanorods.

22 Claims, 4 Drawing Sheets

LASER DIODE USING ZINC OXIDE NANORODS AND MANUFACTURING METHOD THEREOF

CROSS-REFERENCE TO RELATED APPLICATION

This application is a national stage application filed under 35 U.S.C. 371 of International Application No. PCT/KR2010/006172 filed Sep. 10, 2010, which claims priority from Korean Application No. 10-2009-0130085, filed Dec. 23, 2009, each of which is incorporated by reference herein in its entirety.

TECHNICAL FIELD

The present disclosure relates to a laser diode emitting ultraviolet rays. More particularly, the present disclosure relates to a laser diode using zinc oxide nanorods and a method for fabricating the same.

BACKGROUND ART

Among different nanostructures, one-dimensional structures having a large aspect ratio are called nanowires or nanorods, and synthesis thereof using various materials has been developed significantly. Particular examples of such nanostructures include carbon nanotubes (CNT), cobalt silicide (CoSi), etc. Particularly, it is known that nanostructures grown in the form of nanorods have the advantages of higher crystallinity and lower potential density as compared to those grown in the form of thin films. Carbon nanotube powder has already been developed commercially as a transparent electrode or a negative electrode part for electric field emission.

However, such nanorods are not sufficient to be used in any functional device other than a transparent electrode, because they have an excessively small size and low strength. There has been an attempt to develop a field emission transistor (FET) or the like by forming a junction between an individual semiconductor nanorod and a metal, followed by heat treatment. In addition, there has been developed a process including growing semiconductor nanorods on a heterogeneous wafer (a wafer different from a semiconductor material to be grown in terms of a structural form or chemical composition) (e.g.: growing a GaN single crystal thin film on a single crystal sapphire wafer or growing a CuInSe$_2$ thin film on amorphous glass), filling a gap between semiconductor nanorods with an amorphous matrix material, such as silicon dioxide or polyimide, and planarizing the top thereof to form a junction with a metal. However, such a process is still problematic in that the resultant nanorods have low length uniformity and are limited in light emitting surfaces. It is required for a device containing nanorods to be linked amicably with a follow-up process, such as forming an electrode.

Zinc oxide (ZnO) is a material having a wurtzite structure with a hexagonal crystal system, and is a direct transition semiconductor having high transmission of visible light, a relatively high refractive index and dielectric constant and a broad band gap of 3.37 eV. Particularly, since the free exiton bonding energy of zinc oxide is up to 60 meV at room temperature, it is expected that zinc oxide has a higher light extraction ratio caused by optical excitation as compared to currently used gallium nitride. Thus, many studies have been conducted about zinc oxide. Moreover, when zinc oxide nanorods per se function as a cavity for laser generation, laser generation at room temperature may be expected in such nanorods.

However, various methods have been used to prepare zinc oxide but use of zinc oxide has been limited because of difficulties in p-doping. Although some laboratories have provided reports of p-doping results, there are many rooms for improvement in terms of efficiency and reliability.

There has not been reported about laser generation caused by p-n junction of zinc oxide nanorods. Laser generation caused by optical pumping instead of excitation caused by electrical pumping is merely known.

DISCLOSURE

Technical Problem

A technical problem to be solved by the present disclosure is to provide a laser diode using zinc oxide nanorods, which performs UV laser generation easily at room temperature even in an electrical pumping mode by solving p-doping difficulties of a zinc oxide nanorod layer and interfacial defects occurring upon heterogeneous growth of semiconductor nanorods, and facilitates a follow-up process.

Another technical problem to be solved by the present disclosure is to provide a method for fabricating a laser diode using zinc oxide nanorods, by which a device generating UV laser at room temperature through electrical pumping using a zinc oxide semiconductor nanorod layer is obtained.

Technical Solution

In one general aspect, there is provided a laser diode using zinc oxide nanorods, including: a wafer; an electrode layer formed on the wafer; a nanorod layer including a plurality of n-doped zinc oxide nanorods grown on the electrode layer; and a p-doped single crystal semiconductor layer that is physically in contact with the ends of the zinc oxide nanorods.

In another general aspect, there is provided a method for fabricating a laser diode using zinc oxide nanorods, including: forming an electrode layer on a wafer; growing a plurality of n-doped zinc oxide nanorods on the electrode layer to form a nanorod layer; allowing a p-doped single crystal semiconductor layer to be in contact with the nanorod layer; and applying a predetermined level of pressure to the top surface of the single crystal semiconductor layer to fix the single crystal semiconductor layer to the nanorod layer.

Advantageous Effects

According to the embodiments of the present disclosure, it is possible to overcome p-type semiconductor doping difficulties of zinc oxide, while maintaining the advantages of nanostructures including low defects and high crystallinity. It is also possible to perform UV laser generation easily at room temperature even in an electrical pumping mode. Further, it is possible to simplify a process for fabricating a laser diode.

DETAILED DESCRIPTION OF MAIN ELEMENTS

Figure 1:
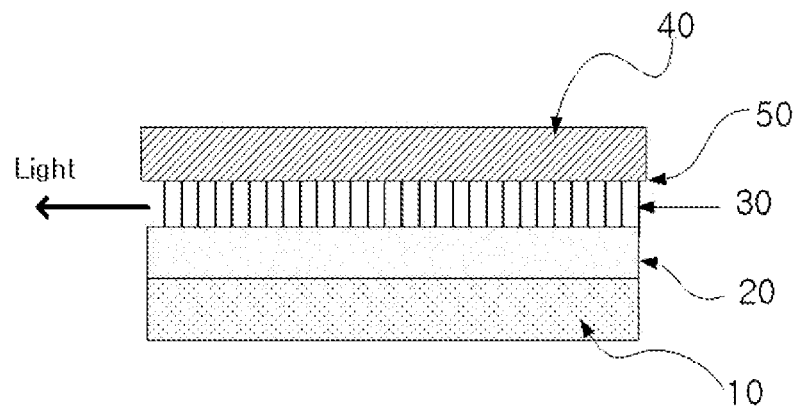
FIG. 1 is a schematic view showing the structure of a laser diode using zinc oxide nanorods according to an embodiment of the present disclosure.

10: wafer 20: electrode layer
30: n-type zinc oxide nanorod layer
40: p-type single crystal semiconductor layer
50: interface between zinc oxide nanorod layer and single crystal semiconductor layer
600: electrode layer for interconnection
700: heat sink layer
800: epoxy

[Best Mode]

Exemplary embodiments now will be described more fully hereinafter with reference to the accompanying drawings, in which exemplary embodiments are shown. This disclosure may, however, be embodied in many different forms and should not be construed as limited to the exemplary embodiments set forth therein.

FIG. 1 is a schematic view showing the structure of a laser diode using zinc oxide nanorods according to an embodiment of the present disclosure.

The laser diode according to an embodiment of the present disclosure uses zinc oxide materials, and is a novel UV (not visible rays) laser diode generating laser through electrical pumping (not optical pumping) in which carriers are injected to any structure of thin films or nanorods.

The wafer 10 may include any one selected from a metal wafer, silicon wafer, glass wafer and a graphite wafer.

The electrode layer 20 is formed on the wafer 10. The electrode layer 20 is formed of a metal or graphene and does not allow light transmission. When the wafer 10 is formed of graphite, the electrode layer 20 may be omitted.

According to some embodiments of the present disclosure, the base on which zinc oxide nanorods are grown is not a semiconductor wafer but an electrode layer 20. The nanorod layer 30 includes a plurality of zinc oxide nanorods grown on the electrode layer 20. The zinc oxide nanorods are n-doped. The zinc oxide nanorods have a dopant concentration of $1 \times 10^{16}$ to $9 \times 10^{20}$/cm$^3$. The zinc oxide nanorods may be aligned vertically to the wafer 10 or may be grown at any angle other than a right angle. The zinc oxide nanorods have a height ranging from 0.3 μm to 300 μm and a diameter ranging from 10 nm up to 1,000 nm. The zinc oxide nanorods are spaced apart from each other to perform laser generation using a so-called optical confinement effect at the interface that is in contact with air.

The single crystal semiconductor layer 40 is p-doped and is physically in contact with the ends of the zinc oxide nanorods. For example, the single crystal semiconductor layer 40 may be any one of p-doped single crystal silicon (Si), gallium arsenide (GaAs) and gallium nitride (GaN) wafers. Particularly, the single crystal semiconductor layer 40 may be one including a p-doped single crystal semiconductor thin film grown on a heterogeneous wafer. The single crystal semiconductor layer 40 has a dopant concentration of $1 \times 10^{17}$ to $9 \times 10^{20}$/cm$^3$.

The single crystal semiconductor layer 40 doped with a second polarity and disposed on the zinc oxide nanorods is a structure substituting for p-n junction. In general, a semiconductor device is formed by junction of a p-type semiconductor with an n-type semiconductor. Such p-n junction may be formed by a diffusion process based on melting of semiconductor materials or ion implantation of dopants, or a simultaneous growth process including injecting dopants when forming a semiconductor thin film or bulk layer. However, the single crystal semiconductor layer 40 is merely in contact with the top of the nanorod layer 30 at the interface 50 as shown in FIG. 1. Thus, any constitutional element of the two layers does not undergo melting and junction caused by heat treatment or other treatments, and the constitutional elements of the two layers are not diffused into each other.

In the structure as shown in FIG. 1, when holes are introduced to the n-type zinc oxide nanorod layer 30 through the contact interface between the p-type single crystal semiconductor layer 40 and the n-type zinc oxide nanorod layer 30 upon the application of forward voltage, light is emitted in an optional direction during the electron-hole recombination. The emitted light causes excitation of exiton present in each n-type zinc oxide nanorod, resulting in an increase in optical density. Herein, each nanorod functions as a cavity having a distance of 0.3 μm to 300 μm in the direction of a long axis and as a cavity having a diameter of 100 nm to 1000 nm in the direction of a short axis, and thus the internal light causes Fabry-Ferot interference. In this manner, a large number of metastable light emission levels are formed inside the nanorods. At a certain point where optical density is increased, light emission occurs continuously at once to the exterior. Then, the emitted light has a wavelength depending on the length and diameter of n-type zinc oxide nanorods, thereby forming multiple interference modes, resulting in emission of light with different wavelengths.

Figure 2:
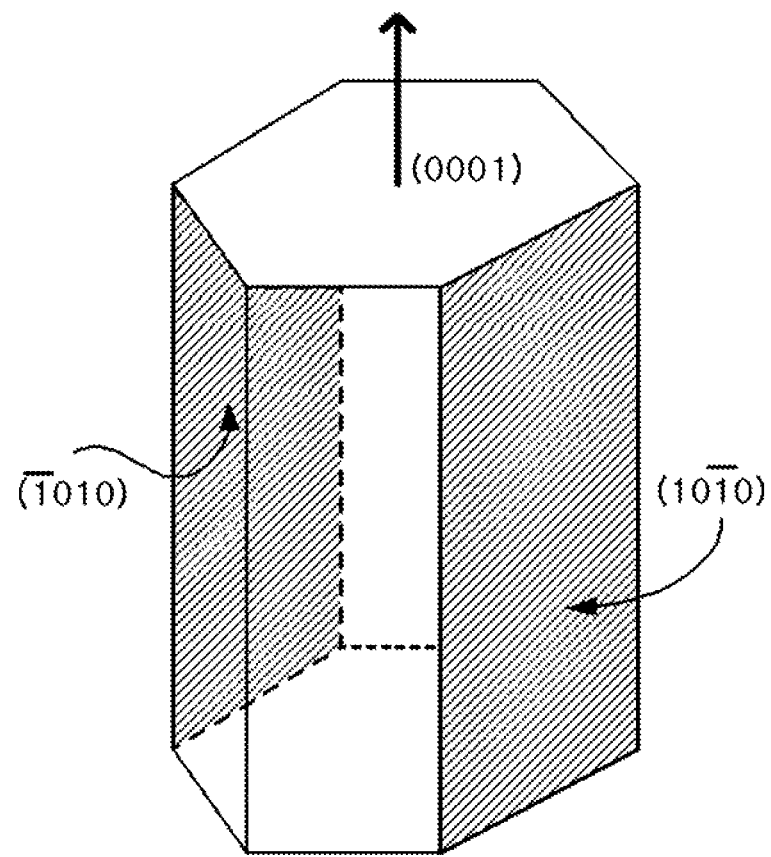
FIG. 2 is a schematic view showing the shape of a zinc oxide nanorod to illustrate cardinal directions of crystal surfaces.

FIG. 2 is a schematic view showing zinc oxide nanorods having a hexagonal crystal system. The nanorods are grown longitudinally along the direction of (0001) surface, and each of the three pairs of surfaces forming the hexagonal column of a nanorod forms a cavity with a distance of 100-1000 nm. In FIG. 2, an embodiment in which (10$\bar{1}$0) surface and ($\bar{1}$010) surface form a parallel cavity is shown.

The method for fabricating a laser diode using zinc oxide nanorods according to an embodiment includes: forming an electrode layer 20 on a wafer 10; growing a plurality of n-doped zinc oxide nanorods on the electrode layer 20 to form a nanorod layer 30; allowing a p-doped single crystal semiconductor layer 40 to be in contact with the nanorod layer 30; and applying a predetermined level of pressure to the top surface of the single crystal semiconductor layer 40 to fix the single crystal semiconductor layer 40 to the nanorod layer 30. Hereinafter, the process of fabricating the above-descried laser diode will be explained in more detail with reference to FIG. 3 to FIG. 5b.

Figure 3:
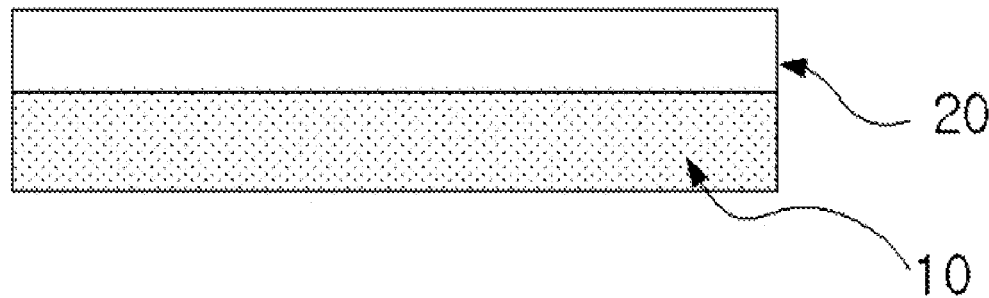
FIG. 3 to FIG. 5b are schematic views illustrating a process for fabricating the laser diode as shown in FIG. 1.

FIG. 3 shows the electrode layer 20 formed on the wafer 10.

Figure 4:
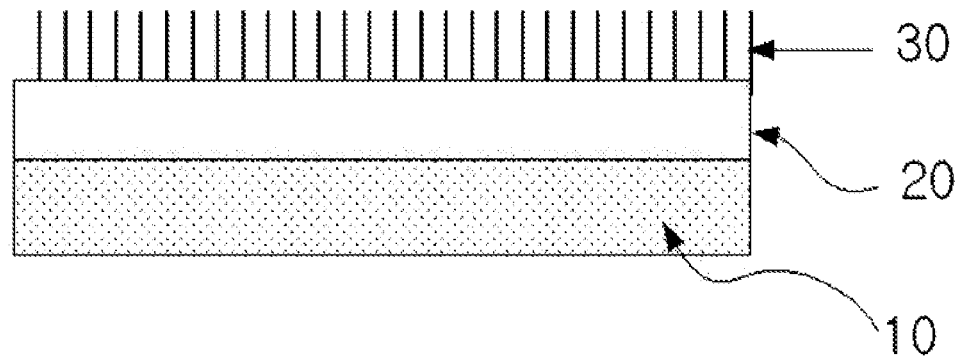

FIG. 4 shows a process of growing zinc oxide nanorods on the electrode layer 20.

According to an embodiment of the present disclosure, the base on which zinc oxide nanorods are grown is not a semiconductor wafer but the electrode layer 20. The process of growing the nanorod layer 30 may be carried out by any one of vapor phase transport, metal-organic source chemical vapor deposition, sputtering, chemical electrolysis deposition and screen printing processes. Particularly, zinc oxide nanorods may be grown directly on the electrode layer 20.

According to another embodiment of the present disclosure, after forming the nanorod layer 30, vacancies among the zinc oxide nanorods may be filled with a material having a higher refractive index than air and a lower refractive index than zinc oxide.

Figure 5A:
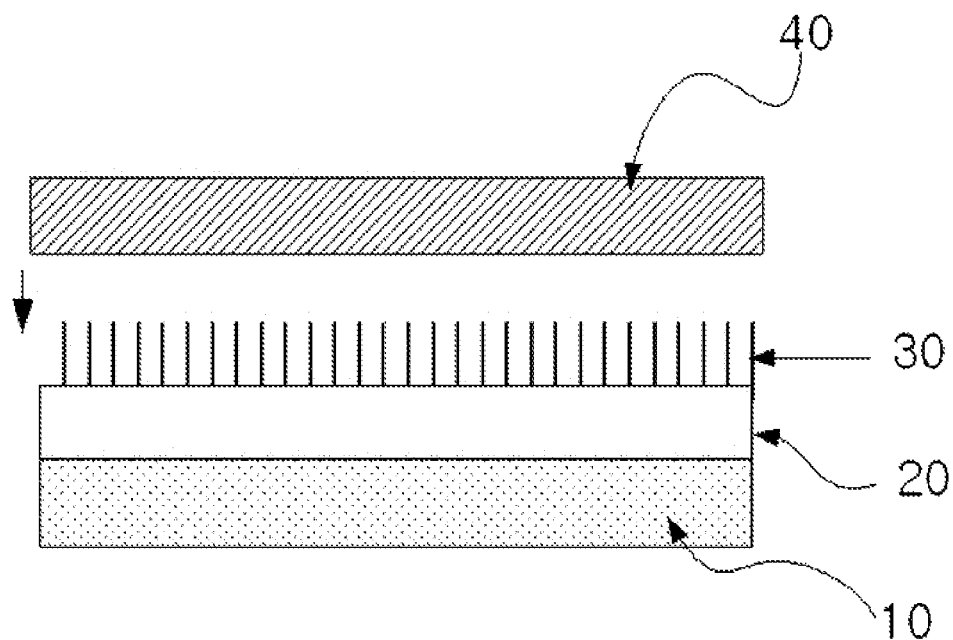

FIG. 5a shows a process of fixing the single crystal semiconductor layer 40 to the nanorod layer 30. When fixing the semiconductor layer 40 to the nanorod layer 30, a pressure of 0.05-8 N/cm² may be applied to the top surface of the single crystal semiconductor layer 40.

Figure 5B:
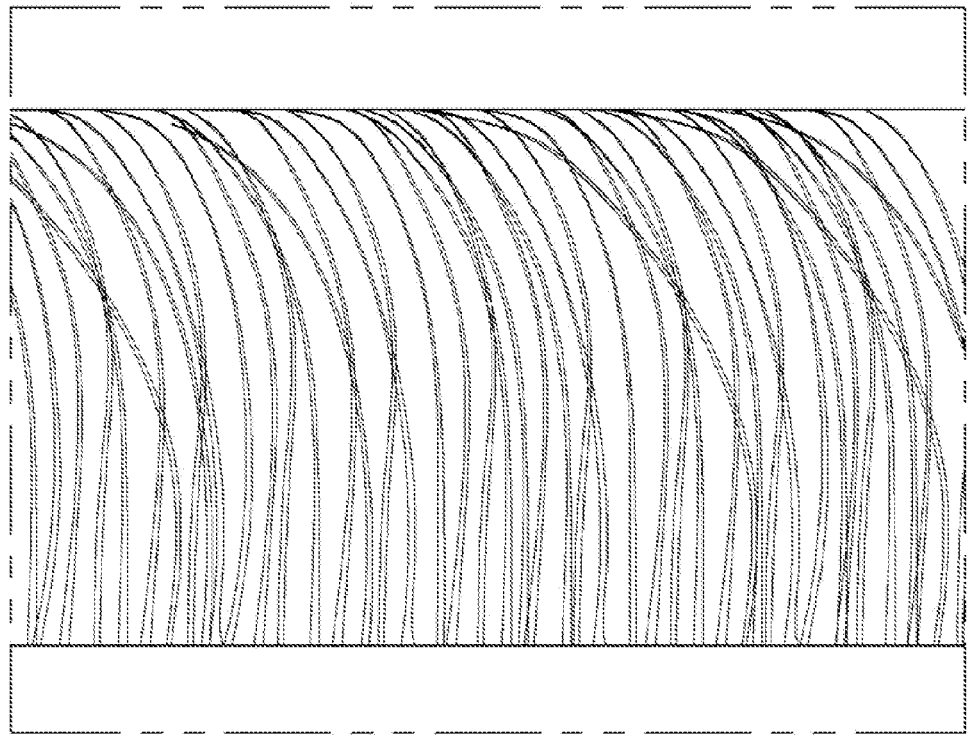
Figure 6:
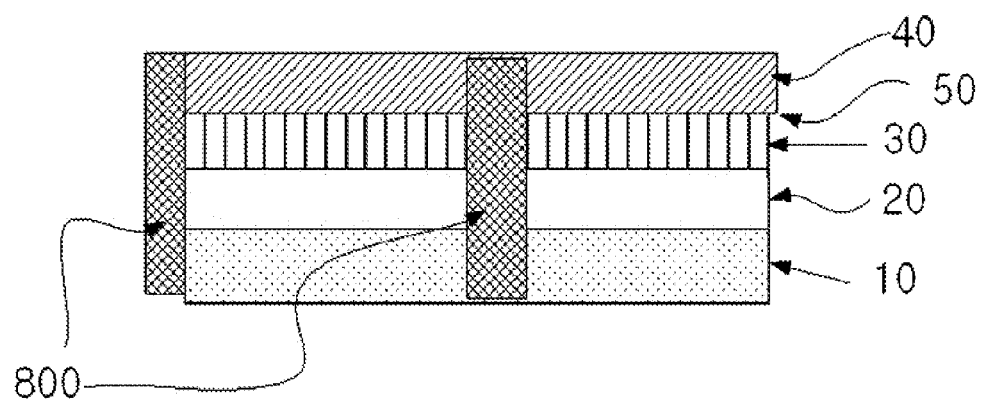
FIG. 6 is a schematic view showing another embodiment of the structure of FIG. 1 fixed with epoxy.

FIG. 5b shows an embodiment in which the single crystal semiconductor layer 40 is fixed by the process as shown in FIG. 5a. Particularly, FIG. 5b shows bent ends of zinc oxide nanorods having a tapered shape and a length of 35 μm. Although the zinc oxide nanorods preferably have a length of several micrometers, even the bent structures as shown in FIG. 5b allow laser generation caused by internal scattering. FIG. 6 shows an embodiment in which the structure of FIG. 1 is fixed with epoxy 800.

Fixing the single crystal semiconductor layer 40 may be carried out with epoxy 800. More particularly, epoxy may be applied in such a manner that the lateral surface of the single crystal semiconductor layer 40, the later surface of the metal electrode layer 20 and the lateral surface of the wafer 10 are linked with each other, while applying pressure to the top surface of the single semiconductor layer 40. Since epoxy endures 300° C., use of epoxy may provide against the subsequent metal treatment process.

Figure 7:
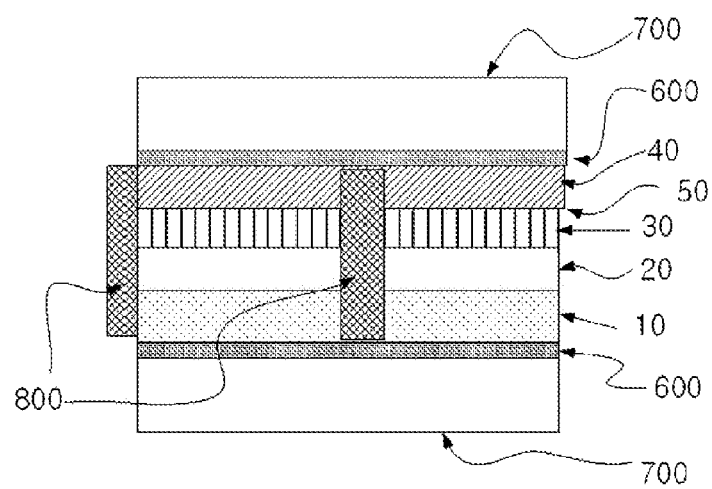
FIG. 7 is a schematic view showing still another embodiment of the structure of FIG. 1 to which an electrode for interconnection and a heat sink layer are added.

FIG. 7 is a schematic view showing still another embodiment of the structure of FIG. 1 to which an electrode 600 for interconnection and a heat sink layer 700 are added.

To form the electrode 600 for interconnection, metal layers are formed on the bottom surface of the wafer 10 and the top surface of the single crystal semiconductor layer 40, and then the metal layers are subjected to heat treatment to form ohmic junction.

When operating the laser diode according to the present disclosure, a large amount of heat may be generated. This results from the contact structure of the device and the presence of silicon oxide on the single crystal silicon wafer. A heat sink layer (e.g. a metal layer) may be attached to at least one of the top surface of the single crystal semiconductor layer 40 and the bottom surface of the wafer 10. Such a heat sink layer 700 may help cooling the heat.

Figure 8:
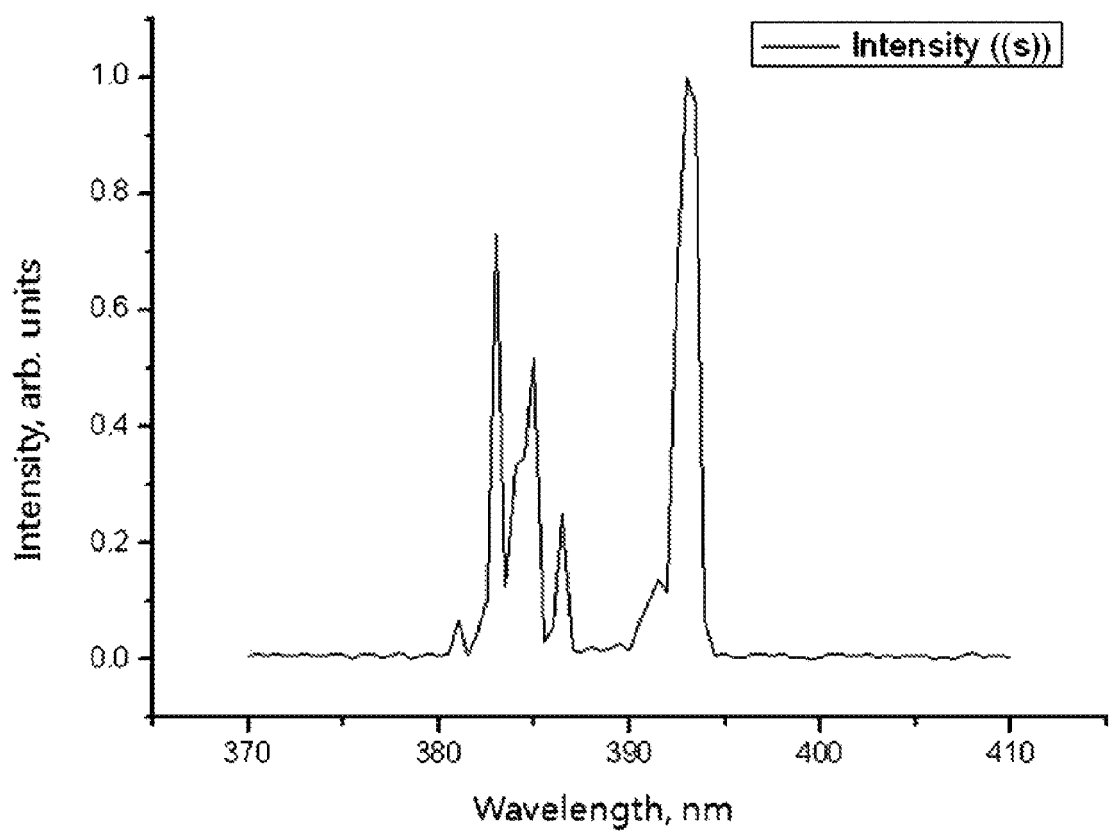
FIG. 8 shows a light emission spectrum of the laser diode according to the structure of FIG. 1 in a UV range.

FIG. 8 shows a light emission spectrum of the laser diode according to the structure of FIG. 1 in a UV range.

The actual contact area between the zinc oxide nanorod layer 30 and the p-type single crystal semiconductor layer 40 is smaller than the area of the p-type single crystal semiconductor layer 40. Provided that the section of a device through which current flows equals to that of the p-type single crystal semiconductor layer 40, it can be seen that UV laser is generated with a full width at half maximum of 1-2 nm in a mode having a wavelength of 383, 384, 385, 386 and 393 nm at a current density of 1 A/cm².

According to an embodiment of the present disclosure, the ends of zinc oxide nanorods are physically in contact with a different kind of p-type material to overcome p-doing difficulties of zinc oxide. Therefore, various kinds and forms of p-type materials other than the p-doped single crystal semiconductor layer 40 used in one embodiment of the present disclosure may be used.

According to another embodiment of the laser diode using zinc oxide nanorods, after providing a wafer 10, forming the electrode layer 20 on the wafer and growing n-doped zinc oxide nanorods 30 on the electrode layer, it is possible to allow a p-doped gallium nitride single crystal semiconductor layer to be in contact with the ends of n-doped zinc oxide nanorods. Since a gallium nitride single crystal semiconductor has an energy band gap of 3.4 eV, which is broader than the energy band gap of silicon, p-n junction of the gallium nitride single crystal semiconductor with zinc oxide nanorods facilitates UV or blue light emission.

However, it is difficult to fabricate a p-doped single crystal gallium nitride wafer by the current state of technology. Thus, according to another embodiment of the present disclosure, it is possible to fabricate a laser diode by allowing a p-doped single crystal gallium nitride semiconductor layer on a sapphire wafer to be in contact with the ends of the n-doped zinc oxide nanorods 30.

According to still another embodiment of a laser diode using zinc oxide nanorods, after providing a wafer 10, forming the electrode layer 20 on the wafer and growing n-doped zinc oxide nanorods 30 on the electrode layer, it is possible to allow a p-doped indium tin oxide (ITO) layer to be in contact with the ends of n-doped zinc oxide nanorods. ITO is a material with a broad energy band gap capable of being controlled to n-type or p-type. Although ITO is not a single crystal material, it is widely used as a transparent electrode. According to this embodiment, a higher hole concentration is advisable. Thus, when a p-doped ITO thin film is allowed to form p-n junction with zinc oxide nanorods, it is possible to expect an increase in light emission efficiency at the zinc oxide nanorods.

According to yet another embodiment of a laser diode using zinc oxide nanorods, after providing a wafer 10, forming the electrode layer 20 on the wafer and growing n-doped zinc oxide nanorods 30 on the electrode layer, it is possible to fabricate a laser diode by allowing a p-doped polyfluorene (PFO) layer to be in contact with the ends of n-doped zinc oxide nanorods. The material brought into contact with the ends of zinc oxide nanorods 30 is p-doped and serves to inject holes. A p-doped polymer layer having high processability formed on a glass wafer may be used to form p-n junction with the ends of zinc oxide nanorods. In general, polymers are amenable to a large-area process and have high cost efficiency. Particularly, PFO has an energy band gap of about 3 eV, and thus facilitates UV and blue light emission.

While the exemplary embodiments have been shown and described, it will be understood by those skilled in the art that various changes in form and details may be made thereto without departing from the scope of this disclosure as defined by the appended claims. Therefore, it is intended that the scope of the present disclosure includes all embodiments falling within the spirit and scope of the appended claims.

[Industrial Applicability]

According to the embodiments of the present disclosure, it is possible to overcome p-type semiconductor doping difficulties of zinc oxide while maintaining the advantages of nanostructures. It is also possible to perform UV laser generation easily at room temperature even in an electrical pumping mode. Further, it is possible to simplify a process for fabricating a laser diode. Therefore, the laser diode according to the present disclosure may be applied to optical communication or other technical fields requiring a UV laser.

The invention claimed is:
1. A laser diode using zinc oxide nanorods, comprising:
a wafer;
an electrode layer formed on the wafer;
a nanorod layer comprising a plurality of n-doped zinc oxide nanorods grown on the electrode layer;
a p-doped single crystal semiconductor layer that is physically in contact with ends of the zinc oxide nanorods; and
metal layers formed on a bottom surface of the wafer and on the top surface of the single crystal semiconductor layer, after fixing the single crystal semiconductor layer to the nanorod layer, wherein the p-doped single crystal semiconductor layer is substantially planar and the metal layer is subjected to heat treatment to form ohmic junction.

2. The laser diode using zinc oxide nanorods according to claim 1, wherein the zinc oxide nanorods are aligned vertically to the wafer.

3. The laser diode using zinc oxide nanorods according to claim 1, wherein the zinc oxide nanorods are grown at any angle other than a right angle to the wafer.

4. The laser diode using zinc oxide nanorods according to claim 1, wherein the zinc oxide nanorods are spaced apart from each other in the shape of hexagonal columns, form a cavity with a distance of 0.3 μm to 300 μm in a direction of long axis in the nanorods having the shape of hexagonal columns, and form a cavity with a diameter of 100 nm to 1000 mn between parallel surfaces of a column in a direction of short axis, thereby performing laser generation using Febry-Perot interference of light in the nanorods.

5. The laser diode using zinc oxide nanorods according to claim 1, which further comprises a material filled in vacancies among the zinc oxide nanorods, wherein the material has a higher refractive index than air and a lower refractive index than zinc oxide.

6. The laser diode using zinc oxide nanorods according to claim 1, wherein the zinc oxide nanorods have a dopant concentration of $1\times10^{16}$ to $9\times10^{20}/cm^3$, and the single crystal semiconductor layer has a dopant concentration of $1\times10^{17}$ to $9\times10^{20}/cm^3$.

7. The laser diode using zinc oxide nanorods according to claim 1, wherein the wafer is any one selected from a metal wafer, silicon wafer, glass wafer and graphite wafer.

8. The laser diode using zinc oxide nanorods according to claim 1, wherein the electrode layer is any one of a metal layer and graphene layer.

9. The laser diode using zinc oxide nanorods according to claim 1, wherein the zinc oxide nanorods have a height ranging from 0.3 μm to 300 μm and a diameter ranging from 10 nm up to 1,000 nm.

10. The laser diode using zinc oxide nanorods according to claim 1, wherein the single crystal semiconductor layer includes any one selected from p-doped single crystal silicon (Si), gallium arsenide (GaAs) and gallium nitride (GaN) wafers.

11. The laser diode using zinc oxide nanorods according to claim 1, wherein the single crystal semiconductor layer is formed by a p-doped single crystal semiconductor thin film grown on a heterogeneous wafer.

12. A laser diode using zinc oxide nanorods, comprising:
a graphite wafer;
a nanorod layer comprising a plurality of n-doped zinc oxide nanorods grown on the graphite wafer;
a p-doped single crystal semiconductor layer that is physically in contact with ends of the zinc oxide nanorods; and
metal layers formed on a bottom surface of the wafer and on the top surface of the single crystal semiconductor layer, after fixing the single crystal semiconductor layer to the nanorod layer,
wherein the p-doped single crystal semiconductor layer is substantially planar and the metal layer is subjected to heat treatment to form ohmic junction.

13. A method for fabricating a laser diode using zinc oxide nanorods, comprising:
forming an electrode layer on a wafer;
growing a plurality of n-doped zinc oxide nanorods on the electrode layer to form a nanorod layer;
allowing a p-doped single crystal semiconductor layer to be in contact with the nanorod layer;
applying a predetermined level of pressure to a top surface of the single crystal semiconductor layer to fix the single crystal semiconductor layer to the nanorod layer; and
forming metal layers on a bottom surface of the wafer and on the top surface of the single crystal semiconductor layer, after fixing the single crystal semiconductor layer to the nanorod layer; and
subjecting the metal layer to heat treatment to form ohmic junction,
wherein the p-doped single crystal semiconductor layer is substantially planar.

14. The method for fabricating a laser diode using zinc oxide nanorods according to claim 13, wherein the nanorod layer is formed by growing the zinc oxide nanorods directly on the metal electrode layer.

15. The method for fabricating a laser diode using zinc oxide nanorods according to claim 13, wherein the nanorod layer is formed by growing the zinc oxide nanorods through any one of vapor phase transport, metal-organic source chemical vapor deposition, sputtering, chemical electrolysis deposition and screen printing processes.

16. The method for fabricating a laser diode using zinc oxide nanorods according to claim 13, wherein the nanorod layer is formed by a process further including filling vacancies among the zinc oxide nanorods with a material having a refractive index higher than the refractive index of air and lower than that of zinc oxide.

17. The method for fabricating a laser diode using zinc oxide nanorods according to claim 13, wherein the single crystal semiconductor layer is any one selected from single crystal silicon wafers, single crystal gallium arsenide (GaAs) wafers and single crystal gallium nitride (GaN) wafers.

18. The method for fabricating a laser diode using zinc oxide nanorods according to claim 13, wherein the single crystal semiconductor layer is p-doped and includes any one of single crystal silicon, gallium arsenide, gallium nitride, indium tin oxide (ITO) and polymer layer, grown on a heterogeneous wafer.

19. The method for fabricating a laser diode using zinc oxide nanorods according to claim 13, wherein the single crystal semiconductor layer is fixed to the nanorod layer by applying a pressure of 0.05-8 N/cm² to the top surface of the single crystal semiconductor layer.

20. The method for fabricating a laser diode using zinc oxide nanorods according to claim 13, wherein the single crystal semiconductor layer is fixed to the nanorod layer by a process further including applying epoxy with which a lateral surface of the single crystal semiconductor layer, a lateral surface of the electrode layer and a lateral surface of the wafer are linked to each other, while applying pressure to the top surface of the single crystal semiconductor layer, wherein the electrode layer comprises a metal electrode layer.

21. The method for fabricating a laser diode using zinc oxide nanorods according to claim 13, which further comprises attaching a heat sink layer to at least one of the top surface of the single crystal semiconductor layer and the bottom surface of the wafer.

22. A method for fabricating a laser diode using zinc oxide nanorods, comprising:
growing a plurality of n-doped zinc oxide nanorods on a graphite wafer to form a nanorod layer;
allowing a p-doped single crystal semiconductor layer to be in contact with the nanorod layer;

applying a predetermined level of pressure to the top surface of the single crystal semiconductor layer to fix the single crystal semiconductor layer to the nanorod layer; and forming metal layers on a bottom surface of the wafer and on the top surface of the single crystal semiconductor layer, after fixing the single crystal semiconductor layer to the nanorod layer; and subjecting the metal layer to heat treatment to form ohmic junction, wherein the p-doped single crystal semiconductor layer is substantially planar.

* * * * *

UNITED STATES PATENT AND TRADEMARK OFFICE
CERTIFICATE OF CORRECTION

| | |
|---|---|
| PATENT NO. | : 8,787,416 B2 |
| APPLICATION NO. | : 13/518440 |
| DATED | : July 22, 2014 |
| INVENTOR(S) | : Lee et al. |

Page 1 of 1

It is certified that error appears in the above-identified patent and that said Letters Patent is hereby corrected as shown below:

In the Claims:

Column 7,
Lines 15 and 16, "1000 mn" should read --1000 nm--.

Signed and Sealed this
Twenty-fifth Day of November, 2014

Michelle K. Lee
*Deputy Director of the United States Patent and Trademark Office*